United States Patent
Kim et al.

(10) Patent No.: US 8,283,804 B2
(45) Date of Patent: Oct. 9, 2012

(54) SEMICONDUCTOR IC DEVICE HAVING POWER-SHARING AND METHOD OF POWER-SHARING THEREOF

(75) Inventors: Hyung-Soo Kim, Ichon (KR); Yong-Ju Kim, Ichon (KR); Sung-Woo Han, Ichon (KR); Hee-Woong Song, Ichon (KR); Ic-Su Oh, Ichon (KR); Tae-Jin Hwang, Ichon (KR); Hae-Rang Choi, Ichon (KR); Ji-Wang Lee, Ichon (KR); Jae-Min Jang, Ichon (KR); Chang-Kun Park, Ichon (KR)

(73) Assignee: SK hynix Inc. (KR)

( * ) Notice: Subject to any disclaimer, the term of this patent is extended or adjusted under 35 U.S.C. 154(b) by 395 days.

(21) Appl. No.: 12/333,194

(22) Filed: Dec. 11, 2008

(65) Prior Publication Data

US 2010/0034043 A1 Feb. 11, 2010

(30) Foreign Application Priority Data

Aug. 11, 2008 (KR) .................. 10-2008-0078395

(51) Int. Cl.
*H02J 1/10* (2006.01)
*H02J 3/38* (2006.01)
*H02J 7/34* (2006.01)

(52) U.S. Cl. ............ 307/44; 307/24; 307/29; 307/43; 307/52; 307/53; 307/54; 307/55; 307/56; 307/57; 307/58; 307/59; 307/60; 713/330; 365/222

(58) Field of Classification Search ............. None
See application file for complete search history.

(56) References Cited

U.S. PATENT DOCUMENTS

| | | | | |
|---|---|---|---|---|
| 4,707,142 A * | 11/1987 | Baker et al. | | 368/46 |
| 5,038,265 A * | 8/1991 | Paladel | | 363/65 |
| 5,266,838 A * | 11/1993 | Gerner | | 307/19 |
| 5,428,524 A * | 6/1995 | Massie | | 363/79 |
| 5,635,772 A * | 6/1997 | Lagree et al. | | 307/64 |
| 5,808,378 A * | 9/1998 | O'Leary | | 307/87 |
| 6,144,115 A * | 11/2000 | Massie et al. | | 307/80 |
| 6,212,118 B1 * | 4/2001 | Fujita | | 365/222 |
| 6,462,434 B1 * | 10/2002 | Winick et al. | | 307/85 |
| 6,700,222 B2 * | 3/2004 | Turvey | | 307/87 |
| 2006/0187721 A1 * | 8/2006 | Freebern | | 365/193 |
| 2006/0221759 A1 * | 10/2006 | Smith et al. | | 365/233 |
| 2007/0007823 A1 * | 1/2007 | Huang et al. | | 307/52 |
| 2007/0253125 A1 | 11/2007 | Kuroda | | |
| 2007/0274135 A1 * | 11/2007 | Choi | | 365/189.05 |
| 2009/0302685 A1 * | 12/2009 | Kramer et al. | | 307/80 |

FOREIGN PATENT DOCUMENTS

JP 06-053322 2/1994
JP 2004-146674 5/2004

* cited by examiner

*Primary Examiner* — Rexford Barnie
*Assistant Examiner* — Justen Fauth
(74) *Attorney, Agent, or Firm* — Baker & McKenzie LLP

(57) ABSTRACT

A semiconductor IC device capable of power-sharing includes a first power line configured to be supplied with a first power, a second power line configured to be supplied with a second power, a switching block configured to connect the first power line with the second power line in response to a first control signal, and a power-sharing control block configured to generate the control signal in accordance with a plurality of operation command signals.

14 Claims, 4 Drawing Sheets

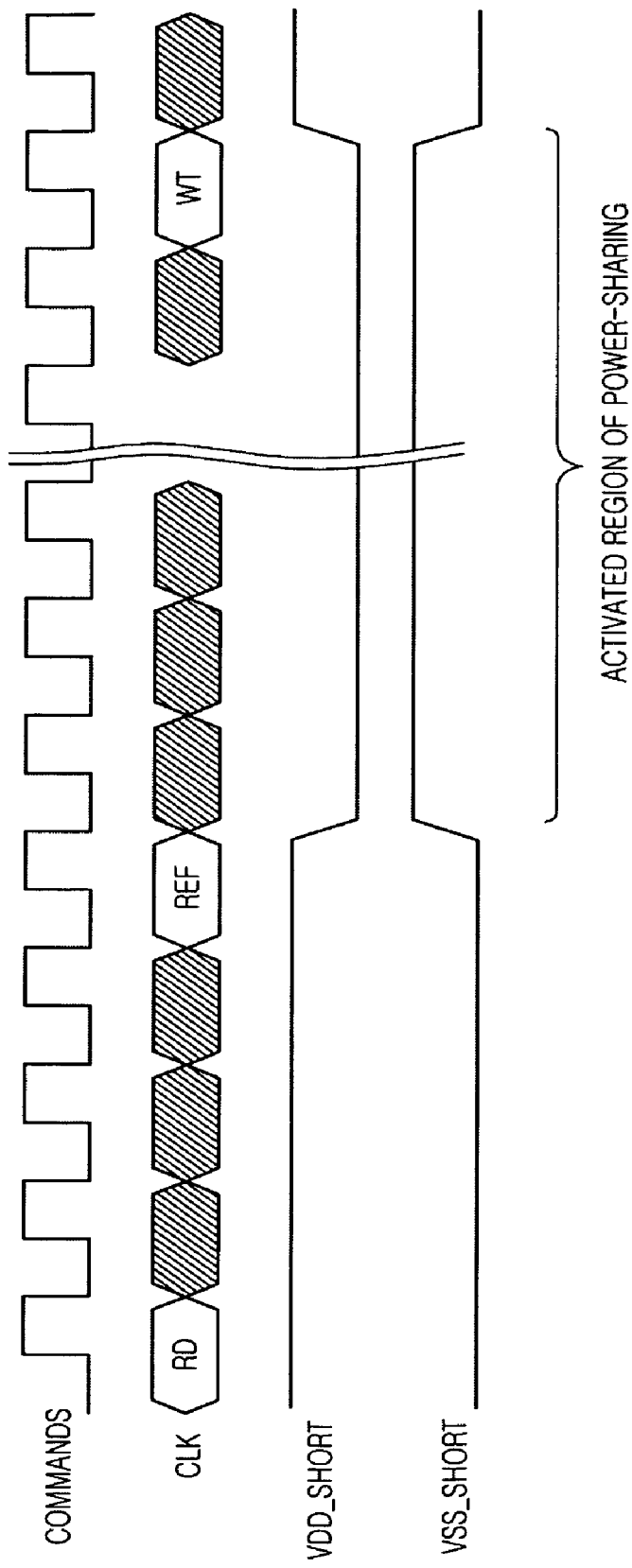

SEMICONDUCTOR IC DEVICE HAVING POWER-SHARING AND METHOD OF POWER-SHARING THEREOF

CROSS-REFERENCES TO RELATED APPLICATION

The present application claims priority under 35 U.S.C. §119(a) to Korean application number 10-2008-0078395, filed on Aug. 11, 2008, in the Korean Intellectual Property Office, which is incorporated herein by reference in its entirety as set forth in full.

BACKGROUND

1. Technical Field

The embodiments described herein relate to a semiconductor integrated circuit (IC) device, particularly a semiconductor IC device capable of power-sharing and a method of power-sharing thereof.

2. Related Art

A power distribution network (PDN) is provided between a semiconductor IC device and a chipset, wherein the semiconductor IC device is supplied with power from an outside unit through the PDN.

Circuits having different noise characteristics, such as analog and digital circuits, are disposed in the semiconductor IC device. As an aside, even digital circuits have different noise characteristics in accordance with the objects. Accordingly, the circuits having different noise characteristics are provided with separate PDNs in order not to be influenced by cross noises from each other.

FIG. 1 is a schematic block diagram of a conventional semiconductor IC device with a power distribution network. In FIG. 1, a first circuit block 11 and a second circuit block 12 are connected with a first power distribution network 20 and a second power distribution network 30, respectively, and power/grounding lines of the first power distribution network 20 and the second power distribution network 30 are separated from each other. Here, the semiconductor IC device uses separate power supplies. However, power efficiency is reduced and power noises negatively influence the separate power distribution networks.

SUMMARY

A semiconductor IC device capable of sharing power supplied through different power distribution network and a method of power-sharing thereof are described herein.

In one aspect, a semiconductor IC device capable of power-sharing includes a first power line configured to be supplied with a first power, a second power line configured to be supplied with a second power, a switching block configured to connect the first power line with the second power line in response to a first control signal, and a power-sharing control block configured to generate the control signal in accordance with a plurality of operation command signals.

In another aspect, a method of power-sharing of a semiconductor IC device to be supplied with different power through a first power line and a second power line includes connecting the first power line and the second power line when operation commands of a first group of operation commands are input, and separating the first power line and the second power line when operation commands of a second group of operation commands are input.

These and other features, aspects, and embodiments are described below in the section "Detailed Description."

BRIEF DESCRIPTION OF THE DRAWINGS

Features, aspects, and embodiments are described in conjunction with the attached drawings, in which:

FIG. 4 is a timing diagram demonstrating exemplary timing sequences according one embodiment.

DETAILED DESCRIPTION

Figure 1:
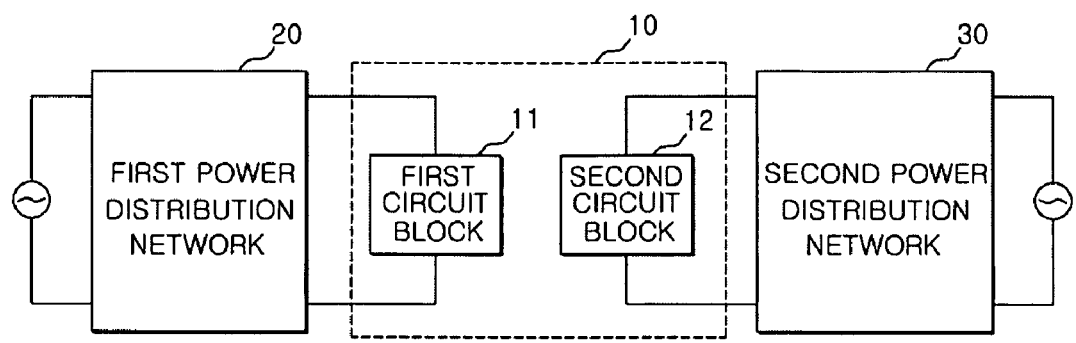
FIG. 1 is a schematic block diagram of a conventional semiconductor IC device with a power distribution network.
Figure 2:
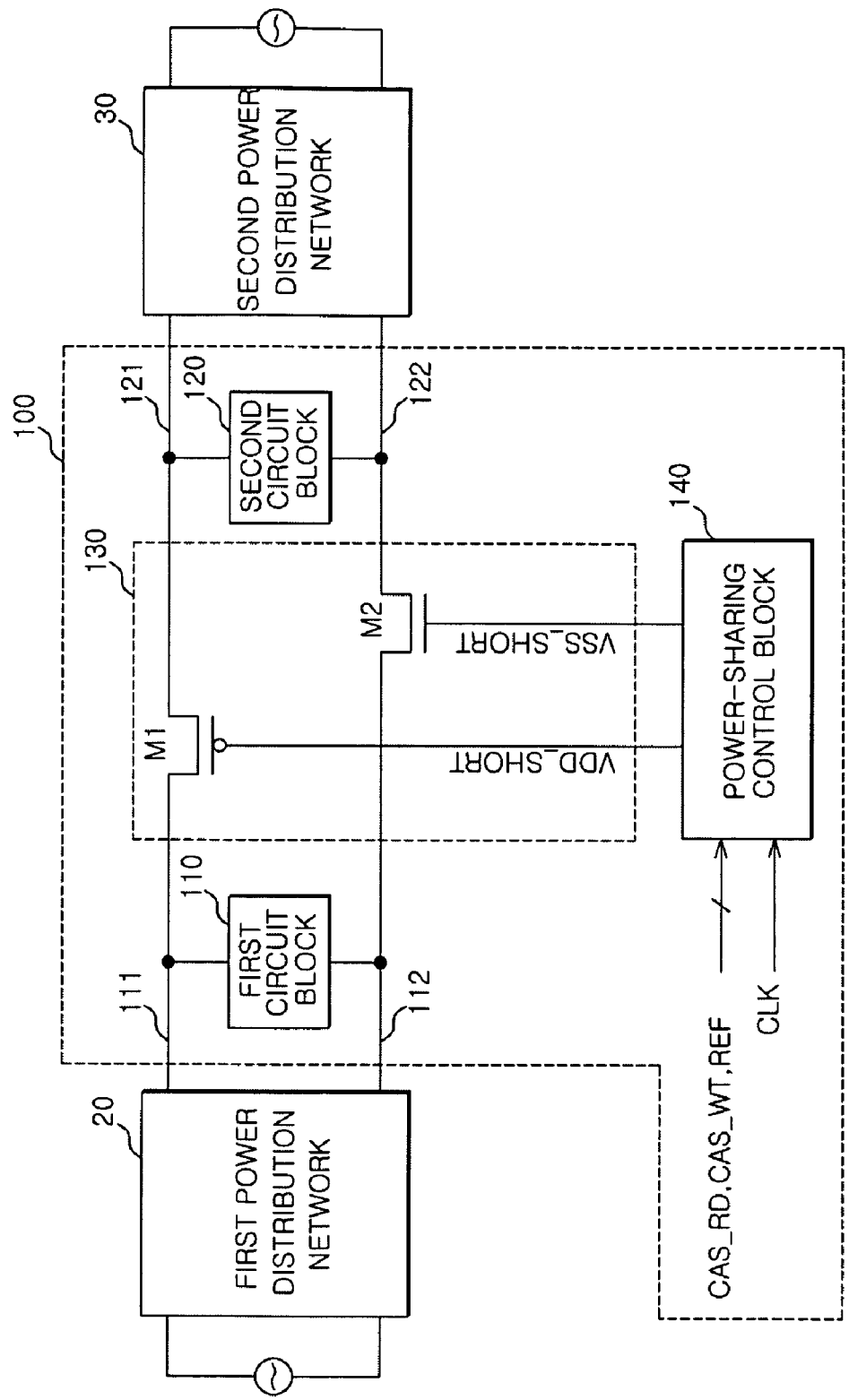
FIG. 2 is a schematic block diagram of an exemplary semiconductor IC device capable of power-sharing according to one embodiment.

FIG. 2 is a schematic block diagram of an exemplary semiconductor IC device capable of power-sharing according to one embodiment. In FIG. 2, operation commands of a semiconductor IC device can be divided into a first group and a second group. For example, operation commands, which define operations of the semiconductor IC device suitable for sharing and using a first power supplied through a first power distribution network 20 and a second power supplied through a second power distribution network 30, can be classified into the first group. In addition, operation commands, which define operations of the semiconductor IC device unsuitable for sharing first power and second power, can be classified into the second group. Similarly, a refresh command can be classified into the first group, and read and write commands can be classified into the second group. For example, a refresh signal 'REF', a read column address strobe signal 'CAS_RD', and a write column address strobe signal 'CAS_WT' can be used to determine whether the refresh command, the read command, and the write command are provided as input signals.

In FIG. 2, a semiconductor integrated circuit 100 capable of power-sharing can be configured to include a first circuit block 110, a first power line 111, a first grounding line 112, a second circuit block 120, a second power line 121, a second grounding line 122, a switching block 130, and a power-sharing control block 140.

The first power line 111 and the first grounding line 112 can be connected with the first power distribution network 20, wherein the first circuit block 110 can be connected between the first power line 111 and the first grounding line 112.

The second power line 121 and the second grounding line 122 can be connected with the second power distribution network 30, wherein the second circuit block 120 can be connected between the second power line 121 and the second grounding line 122.

The switching block 130 can connect the first power line 111 with the second power line 121 in response to a first control signal 'VDD_SHORT', and the switching block 130 can connect the first grounding line 112 with the second grounding line 122 in response to a second control signal 'VSS_SHORT'. For example, the switching block 130 can include a first switching element M1 and a second switching element M2, wherein the first switching element M1 can be connected between the first power line 111 and the second power line 121 and the second switching element M2 can be connected between the first grounding line 112 and the second grounding line 122.

The power-sharing control block 140 can generate the first control signal 'VDD_SHORT' and the second control signal 'VSS_SHORT' in response to the refresh signal 'REF', the read column address strobe signal 'CAS_RD', the write column address strobe signal 'CAS_WT', and a clock signal 'CLK'.

Figure 3:
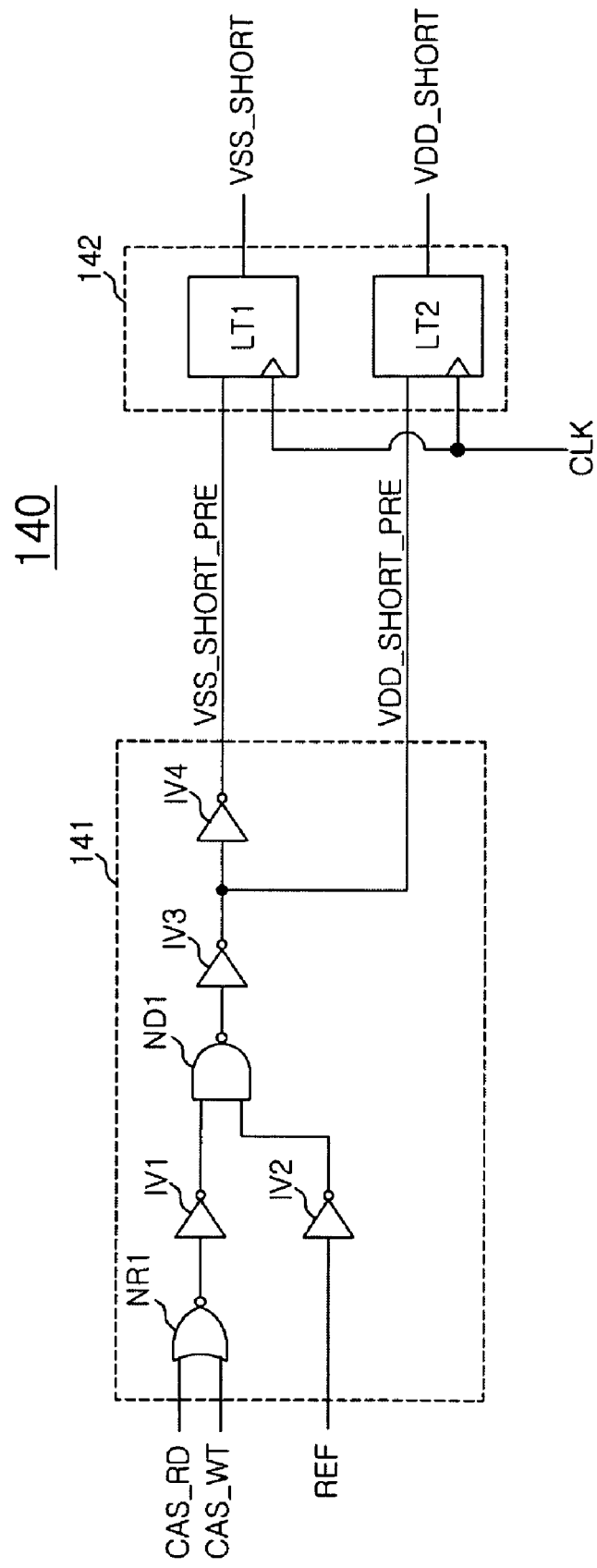
FIG. 3 is a schematic circuit diagram of an exemplary power-sharing control block capable of being implemented in the device of FIG. 2 according to one embodiment.

FIG. 3 is a schematic circuit diagram of an exemplary power-sharing control block capable of being implemented in the device of FIG. 2 according to one embodiment. In FIG. 3, the power-sharing control block 140 can include a signal generating unit 141 and a latch unit 142.

The signal generating unit 141 can be configured to include a NOR gate NR1, a NAND gate ND1, and first to fourth inverters IV1 to IV4. Here, the signal generating unit 141 can generate a pre-first control signal 'VDD_SHORT_PRE' by performing a logical AND operation on an inverted refresh signal 'REF' and the result of a logical OR operation on the read column address strobe signal 'CAS_RD' and the write column address strobe signal 'CAS_WT'. In addition, the signal generating unit 141 can generate a pre-second control signal 'VSS_SHORT_PRE' by inverting the pre-first control signal 'VDD_SHORT_PRE'.

The latch unit 142 can be configured to include a first latch LT1 and a second latch LT2. Here, the latch unit 142 can output the first control signal 'VDD_SHORT' and the second control signal 'VSS_SHORT_PRE' by latching the first pre-first control signal 'VDD_SHORT_PRE' and the pre-second control signal 'VSS_SHORT_PRE' in response to the clock signal 'CLK'.

An exemplary method of using a semiconductor IC device capable of power-sharing will described with reference to FIGS. 2, 3, and 4. FIG. 4 is a timing diagram demonstrating exemplary timing sequences according one embodiment.

In FIG. 4, when the read column address strobe signal 'CAS_RD' is activated by a read command signal, the power-sharing control block 140 can output the first control signal 'VDD_SHORT' at a high level and can output the second control signal 'VSS_SHORT' at a low level. Since the first control signal 'VDD_SHORT' is at a high level and the second control signal 'VSS_SHORT' is at a low level, the first switching element M1 and the second switching element M2 of the switching bock 130 (in FIG. 2) can be turned OFF. In addition, the first power line 111 and the second power line 121 can be correspondingly separated, and the first grounding line 112 and the second grounding line 122 also can be separated.

Accordingly, during a read operation of the semiconductor IC device, the first circuit block 110 and the second circuit block 120 (in FIG. 2) can be independently operated, using power from the first power distribution network 20 and the second power distribution network 30. Furthermore, when the refresh signal 'REF' is activated, the power-sharing control block 140 (in FIG. 3) can output the first control signal 'VDD_SHORT' at a low level and the second control signal 'VSS_SHORT' at a high level, as shown in FIG. 4. Since the first control signal 'VDD_SHORT' is at a low level and the second control signal 'VSS_SHORT' is at a high level, the first switching element M1 and the second switching element M2 of the switching block 130 (in FIG. 2) can be turned ON, and the first power line 111 and the second power line 121 can be correspondingly connected, and the first grounding line 112 while the second grounding line 122 also can be connected. Thus, in a refresh operation of the semiconductor IC device, the first circuit block 110 and the second circuit block 120 can operate while sharing the power of the first power distribution network 20 and the second power distribution network 30.

Furthermore, when the write column address strobe signal 'CAS_WT' is activated by a write command signal, the power-sharing control block 140 (in FIG. 3) can output the first control signal 'VDD_SHORT' at a high level and the second control signal 'VSS_SHORT' at a low level, as shown in FIG. 4. Since the first control signal 'VDD_SHORT' is at a high level and the second control signal 'VSS_SHORT' is at a low level, the first switching element M1 and the second switching element M2 of the switching block 130 (in FIG. 2) can be turned OFF, and the first power line 111 and the second power line 121 can be correspondingly separated, and the first grounding line 112 and the second grounding line 122 also can be separated. Thus, in a write operation of the semiconductor IC device, the first circuit block 110 and the second circuit block 120 (in FIG. 2) can be independently operated, using the power from the first power distribution network 20 and the second power distribution network 30.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A semiconductor IC device capable of power-sharing, comprising:
   a first circuit block configured to be supplied with a first power through a first power line and a first grounding line;
   a second circuit block configured to be supplied with a second power through a second power line and a second grounding line;
   a switching block configured to connect the first power line with the second power line and connect the first grounding line with the second grounding line in response to a control signal; and
   a power-sharing control block configured to generate the control signal in accordance with a plurality of operation command signals, wherein
   the plurality of operation command signals includes a read command signal, a write command signal, and a refresh command signal.

2. The semiconductor IC device of claim 1, wherein the switching block includes a switching element connected between the first power line and the second power line.

3. The semiconductor IC device of claim 1, wherein the power-sharing control block is configured to output the control signal at a level to separate the first power line and the second power line, when one of the read command signal and the write command signal is activated.

4. The semiconductor IC device of claim 1, wherein the power-sharing control block is configured to output the control signal at a level to connect the first power line with the second power line, when the refresh command signal is activated.

5. The semiconductor IC device of claim 1, wherein the power-sharing control block includes:
   a signal generating unit configured to generate the control signal for connecting the first power line with the second power line, by combining a column address strobe signal generated by the read command signal, a column address strobe signal generated by the write command signal, and a refresh signal generated by the refresh command signal, and a latching unit configured to latch the control signal in response to a clock signal.

6. The semiconductor IC device of claim 5, wherein the signal generating unit includes:
 a first logic element configured to perform a logical OR operation on a column address strobe signal generated by the read command signal and a column address strobe signal generated by the write command signal;
 a second logic element configured to invert the refresh command signal;
 a third logic element configured to generate the first control signal by performing a logical AND operation on an output signal of the first logic element and an output signal of the second logic element; and
 a fourth logic element configured to generate the second control signal by inverting the first control signal.

7. A semiconductor IC device capable of power-sharing, comprising:
 a first circuit block configured to be supplied with a first power through a first power line;
 a second circuit block configured to be supplied with a second power through a second power line;
 a first power distribution network configured to supply the first power for the first circuit block;
 a second power distribution network configured to supply the second power for the second circuit block;
 a switching block configured to connect the first power line with the second power line in response to a control signal; and
 a power-sharing control block configured to generate the control signal in accordance with a plurality of operation command signals, wherein
 the plurality of operation command signals includes a read command signal, a write command signal, and a refresh command signal.

8. The semiconductor IC device of claim 7, wherein the power-sharing control block is configured to output the control signal at a level to separate the first power line and the second power line, when one of the read command signal and the write command signal is activated.

9. The semiconductor IC device of claim 7, wherein the power-sharing control block is configured to output the control signal at a level to connect the first power line with the second power line, when the refresh command signal is activated.

10. The semiconductor IC device of claim 7, wherein the power-sharing control block includes:
 a signal generating unit configured to generate a first control signal for connecting the first power line with the second power line and a second control signal for connecting the first grounding line with the second grounding line, by combining a column address strobe signal generated by the read command signal, a column address strobe signal generated by the write command signal, and a refresh signal generated by the refresh command signal, and
 a latching unit configured to latch the first control signal and the second control signal in response to a clock signal.

11. The semiconductor IC device of claim 7, wherein the first power distribution network and the second power distribution network are configured to generate the first power and the second power using different power sources.

12. The semiconductor IC device of claim 7, wherein the first circuit block is configured to be supplied with the first power through the first power line and a first grounding line.

13. The semiconductor IC device of claim 12, wherein the second circuit block is configured to be supplied with the second power through the second power line and a second grounding line.

14. The semiconductor IC device of claim 13, wherein the switching block is configured to connect the first power line with the second power line and connect the first grounding line with the second grounding line in response to the control signal.

* * * * *